US006429493B1

(12) United States Patent
Asahina et al.

(10) Patent No.: US 6,429,493 B1
(45) Date of Patent: Aug. 6, 2002

(54) SEMICONDUCTOR DEVICE AND METHOD FOR MANUFACTURING SEMICONDUCTOR DEVICE

(75) Inventors: Michio Asahina, Sakata; Eiji Suzuki; Kazuki Matsumoto, both of Nagano-ken; Naohiro Moriya, Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/420,025

(22) Filed: Oct. 18, 1999

(30) Foreign Application Priority Data

Oct. 20, 1998 (JP) ............................. 10-298927
Mar. 11, 1999 (JP) ............................. 11-064430

(51) Int. Cl.[7] ............................................. H01L 23/48
(52) U.S. Cl. .................. 257/382; 257/753; 257/763; 257/764; 257/768; 257/382; 257/383; 438/643; 438/653
(58) Field of Search ................... 438/653, 643, 438/683, 722; 257/751, 753, 768, 763, 764, 382, 383

(56) References Cited

U.S. PATENT DOCUMENTS

| 4,908,078 | A | 3/1990 | Muramatsu et al. |
| 5,010,039 | A | 4/1991 | Ku et al. |
| 5,012,309 | A | 4/1991 | Nakayama |
| 5,180,689 | A | 1/1993 | Liu et al. |
| 5,202,579 | A | 4/1993 | Fujii et al. |
| 5,471,418 | A | 11/1995 | Tanigawa |
| 5,482,884 | A | 1/1996 | McCollum et al. |
| 5,498,768 | A | 3/1996 | Nishitani et al. |
| 5,502,334 | A | 3/1996 | Keiji |
| 5,523,626 | A | 6/1996 | Hayashi et al. |
| 5,561,326 | A | 10/1996 | Ito et al. |
| 5,696,017 | A | 12/1997 | Ueno et al. |
| 5,739,046 | A | 4/1998 | Lur et al. |
| 5,843,843 | A | 12/1998 | Lee et al. |
| 5,858,837 | A | 1/1999 | Sakoh et al. |
| 5,918,149 | A | 6/1999 | Besser et al. |
| 5,939,787 | A | 8/1999 | Lee |
| 5,956,608 | A | 9/1999 | Khurana et al. |
| 5,985,759 | A | * 11/1999 | Kim et al. .................. 438/653 |
| 6,054,768 | A | 4/2000 | Givens et al. |
| 6,114,097 | A | * 11/2000 | Asahina et al. ............. 257/751 |
| 6,153,515 | A | * 11/2000 | Murakami et al. .......... 438/643 |

FOREIGN PATENT DOCUMENTS

| JP | 4-64222 | 2/1922 |
| JP | 6-5715 | 1/1994 |
| JP | 8-203896 | 8/1996 |
| JP | 11-17004 | 1/1999 |
| WO | 98/24116 | 6/1998 |

* cited by examiner

Primary Examiner—Tom Thomas
Assistant Examiner—Donghee Kang
(74) Attorney, Agent, or Firm—Hogan & Hartson, L.L.P.

(57) ABSTRACT

A semiconductor device includes a semiconductor substrate having a device element, an interlayer dielectric layer (silicon oxide layer, BPSG layer) formed on the semiconductor substrate, a through hole defined in the interlayer dielectric layer, a barrier layer formed on surfaces of the interlayer dielectric layer and the through hole, and a wiring layer formed on the barrier layer. The barrier layer includes a first metal oxide layer formed from an oxide of a metal that forms the barrier layer (e.g., a first titanium oxide layer), a metal nitride layer formed from a nitride of the metal that forms the barrier layer (e.g., a titanium nitride layer), and a second metal oxide layer formed from an oxide of the metal that forms the barrier layer (e.g., a second titanium oxide layer). The semiconductor device thus manufactured has a barrier layer of an excellent barrier capability.

5 Claims, 6 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the same and, more particularly, to a semiconductor device that has an excellent barrier capability in its miniaturized contact section and a method for manufacturing the same.

2. Description of Related Art

With higher device miniaturization, higher density integration, and increased multiple layers of LSI devices, it has become an important object to develop techniques for embedding wiring material in miniaturized through holes with greater aspect ratios. In the conventional technique, a tungsten plug is embedded in a through hole in a contact section, for example, in order to plug the through hole and to prevent reaction between aluminum of the wiring layer and silicon of the silicon substrate. The through hole typically has an aperture diameter of 0.5 µm or smaller and an aspect ratio of 2 or greater. However, such a contact structure tends to result in greater electrical resistance of the tungsten, deterioration of resistance to electromigration, and lowered production yield due to its complicated forming process. Many attempts are being made to develop techniques for embedding aluminum in through holes without requiring a complicated embedding process that is currently required for tungsten plugs.

However, contact sections that use aluminum require thorough countermeasures against junction leaks that may be caused by reaction between the aluminum and silicon of the silicon substrate, and also require a high barrier capability of a barrier layer.

For example, a barrier layer is formed from a nitride layer of a high melting point metal, such as a titanium nitride layer, that is formed in a nitrogen atmosphere by reaction sputtering. Such a barrier layer has the following problems. ① A titanium nitride layer, when formed by reactive sputtering in a nitrogen atmosphere, has an insufficient coverage. Therefore, it does not provide a sufficient coverage at a bottom portion of a miniaturized through hole having a high aspect ratio. ② A titanium nitride layer, when formed by reactive sputtering in a nitrogen atmosphere, has large film stresses and therefore tends to develop microscopic cracks. As a result, aluminum in the wiring material tends to diffuse and cause junction leaks. ③ A titanium nitride layer, when formed by reactive sputtering in a nitrogen atmosphere, has columnar crystals. As a result, aluminum tends to diffuse through crystal grain boundaries, causing junction leaks. ④ The crystal orientation of a titanium nitride layer determines a <111> crystal orientation of an aluminum layer. Because the crystal orientation of a titanium nitride is not always uniform, the plane azimuth in the <111> crystal orientation of the aluminum layer differs. As a result, the surface of the aluminum layer roughens, and alignment becomes difficult in photolithography of the aluminum layer. ⑤ Further, a titanium nitride layer, when formed by reactive sputtering in a nitrogen atmosphere, occasionally peels off during film formation because of its own film stresses and therefore tends to generate particles. The particles pollute the surface of the wafer and cause short-circuits, and therefore are a source of lowered production yield.

SUMMARY OF THE INVENTION

It is an object of the present invention to provide a semiconductor device having a miniaturized contact section of a half-micron or less in size that enables optimum embedding of a conductive material in the miniaturized contact section, and that achieves a high barrier capability without causing junction leaks. The present invention also relates to a method for manufacturing the semiconductor device.

In accordance with one embodiment of the present invention, a semiconductor device includes a semiconductor substrate having a device element and an interlayer dielectric layer formed on the semiconductor substrate. A through hole is formed in the interlayer dielectric layer. A barrier layer is formed on surfaces of the interlayer dielectric layer and the through hole. A wiring layer is formed on the barrier layer. In accordance with one embodiment of the present invention, the barrier layer includes at least a metal oxide layer and a metal nitride layer. The metal oxide layer is composed of an oxide of a metal that forms the barrier layer. The metal nitride layer is composed of a nitride of the metal that forms the barrier layer. As a result, the barrier layer presents a high conductivity and an excellent barrier capability.

In one embodiment, the barrier layer may preferably include a first metal oxide layer, a metal nitride layer, and a second metal oxide layer. The first metal oxide layer is composed of an oxide of a metal that forms the barrier layer. The metal nitride layer is composed of a nitride of the metal that forms the barrier layer. The second metal oxide layer is composed of an oxide of the metal that forms the barrier layer. In one embodiment, the first and second metal oxide layers that form the barrier layer may preferably be in an amorphous form. As a result, the barrier layer attains a high barrier capability.

The first metal oxide layer that forms the barrier layer may preferably have a film thickness of about 5–30 nm in consideration of its barrier capability and conductivity. In a similar manner, the second metal oxide layer that forms the barrier layer may preferably have a film thickness of about 5–30 nm. These metal oxide layers may be continuous or discontinuous to one another.

The wiring layer may preferably be formed from aluminum or an alloy to containing aluminum as a main component. In addition to aluminum and an aluminum alloy, other materials, such as, for example, copper, gold, white gold and the like, may also be used for the wiring layer. Depending on the requirements, tungsten plugs may also be used as a material for embedding through holes.

A semiconductor device in accordance with one embodiment of the present invention is manufactured by a method including the steps of forming a through hole in an interlayer dielectric layer formed on a semiconductor substrate having a device element, and forming a barrier layer on surfaces of the interlayer dielectric layer and the through hole, and forming a wiring layer on the barrier layer. In one embodiment, the barrier layer may be formed by the following process: (a) a metal layer that forms the barrier layer is formed on a semiconductor substrate; (b) a heat treatment is conducted in a hydrogen atmosphere to form a hydrogenated alloy of the metal layer or cause occlusion of hydrogen in the metal layer; (c) the metal layer is contacted with oxygen in an atmosphere including oxygen; and (d) a heat treatment is conducted in a nitrogen atmosphere to form a metal oxide layer and a metal nitride layer.

In the above-described manufacturing method, the barrier layer may include a metal oxide layer and a metal nitride layer. In one embodiment of the present invention, the barrier layer includes a first metal oxide layer composed of an oxide of a metal that forms the barrier layer, a metal nitride layer composed of a nitride of the metal that forms the barrier layer, and a second metal oxide layer composed of an oxide of the metal that forms the barrier layer.

In the manufacturing method in accordance with one embodiment of the present invention, a single metal layer may be formed by a sputtering method or a CVD method in step (a). Then, a metal nitride layer is formed in step (d). As a result, the barrier layer is formed with better cohesiveness and coverage at bottom sections of through holes compared to, for example, a metal nitride layer that is directly formed by a sputtering method. Also, after the metal layer is formed in step (a), the metal layer is processed in step (b) to form a hydrogenated alloy of the metal layer or to cause occlusion of hydrogen in the metal layer. As a consequence, reaction between silicon of the semiconductor substrate and a metal of the metal layer is suppressed in a heat treatment that is later performed. As a result, nitrogenization reaction and oxidation reaction of the metal are securely performed in step (d), with the result that the metal nitride layer and metal oxide layer are formed. As a result, the barrier capability of the barrier layer is greatly improved, and the conductivity of the barrier layer is secured because of the presence of the metal oxide layer.

It is not very clear why the metal oxide layer is formed in two layers, namely, a first metal oxide layer and a second metal oxide layer, with a metal nitride layer being formed in between. It is believed that such a structure is formed in the following manner. Oxygen is occluded in the metal layer that is formed in step (a). When the metal layer is brought in contact with oxygen in step (c), the oxygen is introduced in the inside of the metal layer and/or adsorbed on the surface of the metal layer. Then, in the heat treatment in step (b), a part of the first metal oxide layer is formed, and in the heat treatment in step (d), formation of the first metal oxide layer further progresses and the metal nitride layer and the second metal oxide layer are formed.

In step (b), the heat treatment may preferably be conducted at temperatures of about 200–800° C. to sufficiently form a hydrogenated alloy of the metal layer or sufficiently cause occlusion of hydrogen in the metal layer. The hydrogen content of the hydrogen atmosphere may preferably be at about 1–100%, depending on the treatment temperature.

In step (c), the atmosphere including oxygen may preferably include at least 10% oxygen and, more preferably, about 10–30% oxygen. In this step, oxygen is brought in contact with the surface of the metal layer that has changed to a hydrogenated alloy or is occluded with hydrogen in step (b).

In step (d), the heat treatment may preferably be conducted at temperatures of about 600–900° C., so that separation of hydrogen as well as nitrogenization and oxidation of the metal layer take place. The pressure of the atmosphere in step (d) is not limited to a particular range, but may preferably be at normal pressure.

The metal that forms the barrier layer may preferably include, in view of good barrier capability and the conductivity, at least one selected from a group consisting of titanium, cobalt, ruthenium, molybdenum, hafnium, niobium, vanadium, tantalum and tungsten.

The metal layer that forms the barrier layer may preferably have a film thickness of about 50–150 nm in consideration of the film thickness of the metal nitride layer and the metal oxide layer formed in a step later performed.

Other features and advantages of the invention will be apparent from the following detailed description, taken in conjunction with the accompanying drawings which illustrate, by way of example, various features of embodiments of the invention.

PREFERRED EMBODIMENTS

FIGS. 1–6 illustrate a method for manufacturing a semiconductor device in accordance with one embodiment of the present invention. FIG. 7 generally shows an embodiment of a semiconductor device in cross-section manufactured by the method. An example of a method for manufacturing a semiconductor device will be described below.

Figure 1:
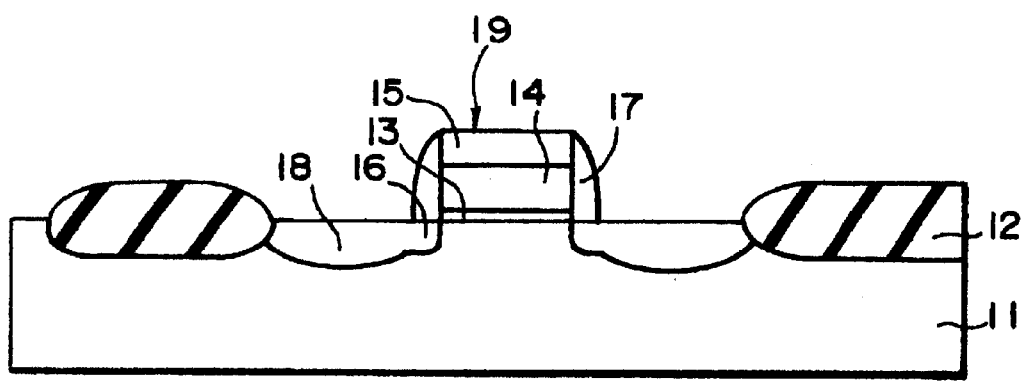
FIG. 1 schematically shows a step in a process for making a semiconductor device in cross-section in accordance with one embodiment of the present invention.

A MOS element is formed in a silicon substrate 11 by a commonly practiced method, as shown in FIG. 1. For example, a field insulation layer 12 is formed on the silicon substrate 11 by selective oxidation, and a gate oxide layer 13 is formed in an active region. A threshold voltage level is adjusted by channel injection, then a tungsten silicide layer 15 is sputter-deposited on a polysilicon layer 14 that is formed by pyrolyzing monosilane ($SiH_4$). Further, the layers are etched to a specified pattern to form a gate electrode 19.

Then, phosphorous is ion-implanted to form a low concentration impurity layer 16 for a source region or a drain region. Side-wall spacers 17 of silicon oxide films are formed on sides of the gate electrode 19. Then arsenic is ion-implanted, and the impurity is activated by an anneal treatment using a halogen lamp to thereby form a high impurity concentration layer 18 for the source region or the drain region.

Figure 2:
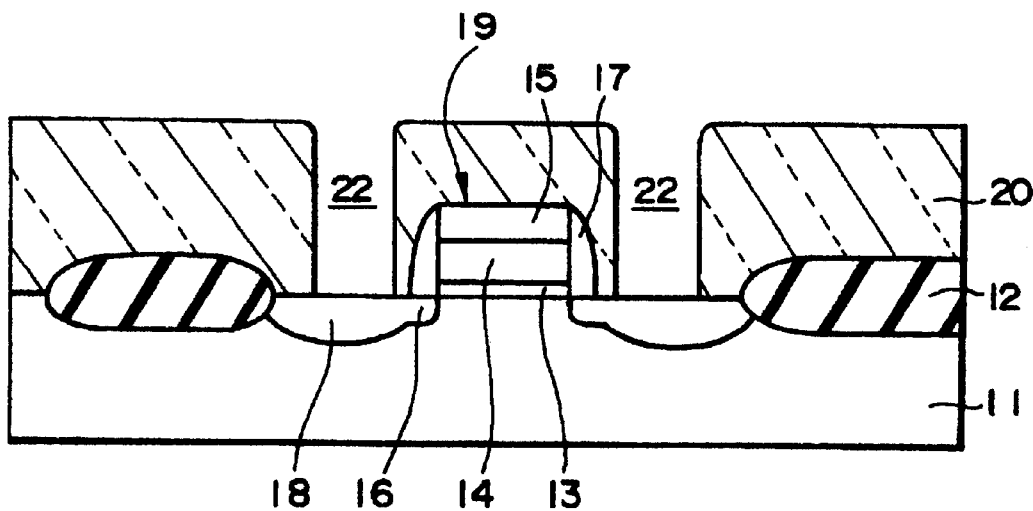
FIG. 2 schematically shows a step in the process for making a semiconductor device in cross-section that is successively performed after the step shown in FIG. 1.

Next, a silicon oxide layer (not shown) having a film thickness of about 100–200 nm, that serves as a base layer of an interlayer dielectric layer 20 shown in FIG. 2, is formed by the plasma reaction between tetraethylorthosilicate (TEOS) and oxygen. The silicon oxide layer does not have cuspings, and has a greater insulation, a slower etching speed against a hydrogen fluoride solution, and a higher density than a layer that is grown from $SiH_4$.

Then, a boron-doped phosphosilicate glass (BPSG) layer (not shown), having a film thickness of about several hundreds nm–1 µm, is formed on the silicon oxide layer as a planarization layer of the interlayer dielectric layer 20 by vapor phase reaction of $SiH_4$, or a silane compound such as TEOS with oxygen, ozone and gases including phosphorous and boron. An anneal treatment is then performed in a nitrogen atmosphere at temperatures of about 800–900° C. to conduct a high temperature flow planarization. Instead of the high temperature flow of the BPSG layer, a commonly used SOG film can be used to conduct planarization.

Instead of the BPSG layer, a silicon oxide layer may be used that is formed by a method described in a patent application filed by the present applicant (for example, Laid-open Japanese patent application HEI 9-314518), in which a silicon compound and hydrogen peroxide are reacted by a chemical vapor deposition method. The resultant silicon oxide layer has a high flowability and excellent self-planarization characteristics. This phenomenon is believed to take place due to the following mechanism. When a silicon compound and hydrogen peroxide are reacted by the chemical vapor deposition method, silanol is formed in the vapor phase, and the silanol deposits on the surface of the wafer to provide a layer having a high flowability.

The silicon compounds include, for example, inorganic silane compounds, such as monosilane, disilane, $SiH_2Cl_2$, $SiF_4$, and organo silane compounds, such as $CH_3SiH_3$, tripropyle-silane, tetraethylorthosilicate and the like.

The film formation process for forming the silicon oxide layer may preferably be conducted by a reduced pressure chemical vapor deposition method at temperatures of about 0–20° C., when the silicon compound is an inorganic silicon compound, and at temperatures of about 100–150° C., when the silicon compound is an organic silicon compound.

Next, the BPSG layer (planarization layer) that forms the interlayer dielectric layer 20 and the silicon oxide layer (base layer) are selectively, anisotropically etched by a reactive ion etcher containing $CHF_3$ and $CF_4$ as main gases to form through holes 22. Each of the through holes, as shown in FIG. 2, has a diameter of about 0.2–0.5 µm and an aspect ratio of about 2–5.

Next, formation of a barrier layer will be described hereunder.

Figure 3:
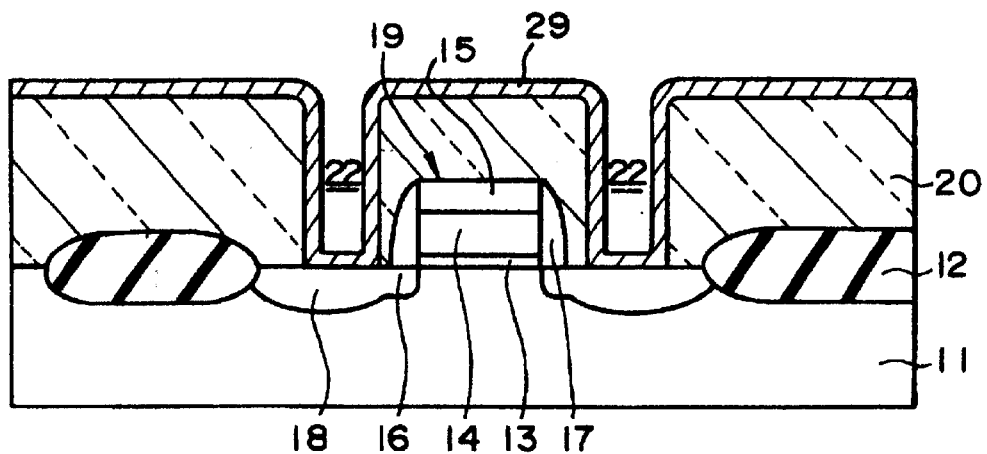
FIG. 3 schematically shows a step in the process for making a semiconductor device in cross-section that is successively performed after the step shown in FIG. 2.
Figure 4:
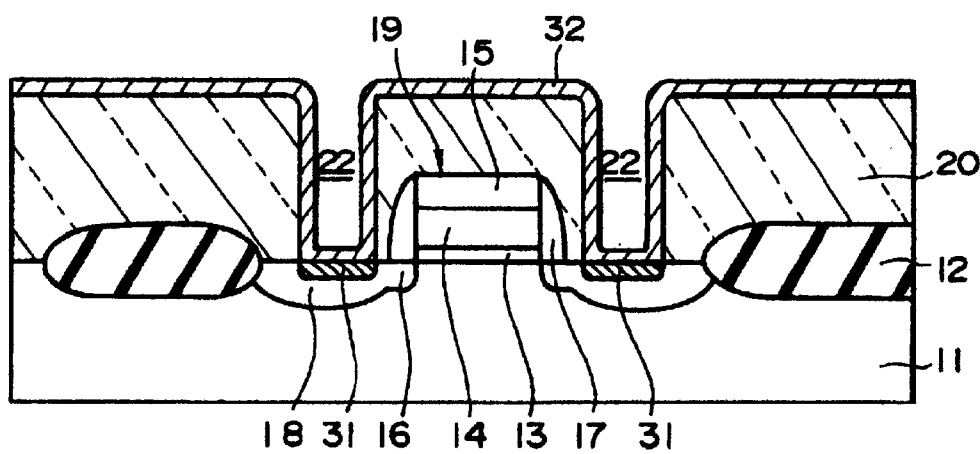
FIG. 4 schematically shows a step in the process for making a semiconductor device in cross-section that is successively performed after the step shown in FIG. 3.

As shown in FIG. 3, a titanium layer 29 is formed to a film thickness of 50–150 nm on surfaces of the interlayer dielectric layer 20 and the through holes 22 by a super-long throw sputter apparatus in which a target and the wafer are spaced at a distance of about 150–320 mm. The film thickness of the titanium layer 29 at bottom sections of the through holes 22 is about 15–80 nm. Also, the titanium layer 29 provides a good coverage over the through holes 22 and has almost no overhang at upper sections of the through holes 22. The super-long throw sputtering employed to form the titanium layer 29 makes the pinch-off phenomenon difficult to occur. In the pinch-off phenomenon, a through hole may be closed by reaction between a metal that forms a wetting layer and aluminum that forms an embedded layer over the through hole. In addition to titanium, other metals, such as cobalt, ruthenium, molybdenum, hafnium, niobium, vanadium, tantalum and tungsten, may be used as a metal that forms the barrier layer.

Then, the wafer is subjected to an anneal treatment in a 100% hydrogen atmosphere at temperatures of about 200–800° C. for about 20–60 minutes. As a result, the titanium layer 29 becomes a hydrogenated alloy or occludes hydrogen. For example, in the case of titanium, when an anneal treatment is conducted at 400° C. for 20 minutes, 10 atom % or higher hydrogen is occluded in the titanium layer so that a TiHx alloy layer 32 is formed, and a titanium silicide layer 31 is formed in a boundary region along the silicon substrate 11 by reaction between the titanium and silicon. Further, an oxygen-rich layer is formed in the uppermost surface of the titanium layer 29.

In the above heat treatment, the metal layer is processed to form a hydrogenated alloy or to cause occlusion of hydrogen in the metal layer. As a consequence, reaction between silicon of the semiconductor substrate and (titanium of the metal layer is suppressed to a degree in the anneal treatment. As a result, nitrogenization reaction and oxidation reaction of the metal are securely (performed in a later stage, so that the metal nitride layer and metal oxide layer are formed.

Then, the wafer is placed in an atmosphere containing oxygen, such as, for example, air to bring the TiHx alloy layer 32 in contact with oxygen. As a result, oxygen is adsorbed on the surface of the TiHx alloy layer 32.

In one embodiment, the wafer may be placed in an atmosphere containing oxygen of 10–30 volume % in concentration, instead of air.

Figure 5:
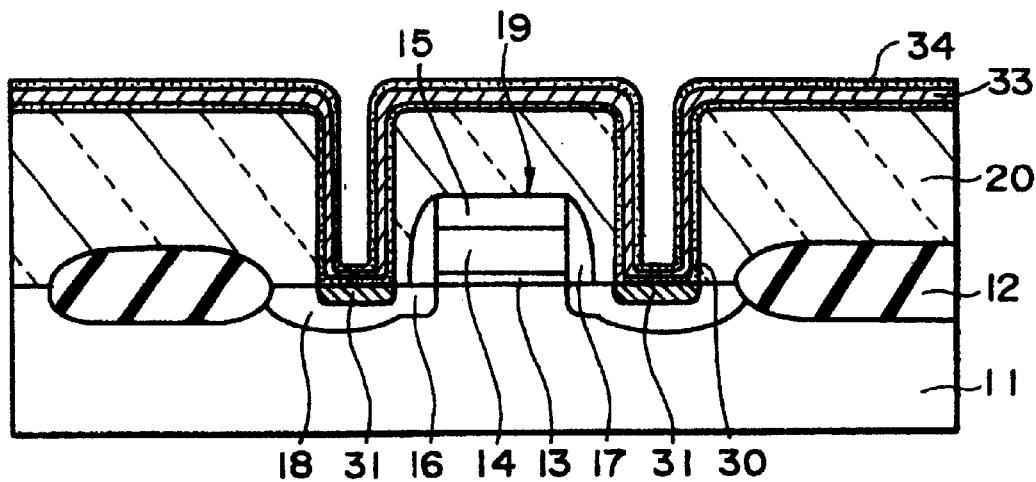
FIG. 5 schematically shows a step in the process for making a semiconductor device in cross-section that is successively performed after the step shown in FIG. 4.

Then, a lamp anneal heat treatment is conducted in a nitrogen atmosphere under normal pressure at temperatures of 600–800° C. for 10–60 seconds. As a result, the metal layer is changed to form nitride, silicide and oxide layers. In the lamp anneal heat treatment, most of the hydrogen is separated from the TiHx alloy layer 32, a titanium nitride layer 33 is formed by reaction between the titanium and nitrogen, and a titanium silicide layer 31 is formed by reaction between the titanium and silicon of the silicon substrate 11, as shown in FIG. 5. At the same time, titanium oxide layers are formed. As shown in FIG. 7 in an enlarged scale, a first titanium oxide layer (a first metal oxide layer) 30 is formed in a boundary region between the titanium silicide layer 31 (and the interlayer dielectric layer 20) and the titanium nitride layer 33, and a second titanium oxide layer (a second metal oxide layer) 34 is formed on surfaces of the titanium nitride layer 33. It has been confirmed that the first titanium oxide layer 30 (a first metal oxide layer) is in an amorphous form. It has also been confirmed that the second titanium oxide layer 34 is discontinuously formed on the surfaces of the titanium nitride layer 33 and is in the amorphous state. The first titanium oxide layer that forms the barrier layer may preferably have a film thickness of about 5–30 nm in consideration of its barrier capability and conductivity. In a similar manner, the second titanium oxide layer that forms the barrier layer may preferably have a film thickness of about 5–30 nm.

Due to the first and second titanium oxide layers 30 and 34, the barrier layer has an excellent barrier capability. Also, the film thickness of the first and second titanium oxide layers 30 and 34 and the lamp anneal temperature are controlled so that the barrier layer is provided with sufficient conductivity. By the process described above, the barrier layer includes at least the first titanium oxide layer 30, the titanium nitride layer 33 and the second titanium oxide layer 34.

When the barrier layer is formed by the process described above, an oxygen-plasma treatment may be conducted, depending on the requirements. In the oxygen plasma treatment, the layers are exposed to oxygen plasma at pressures of about $0.1 \times 10^2$–$1.5 \times 10^2$ Pa for about 10–100 seconds and annealed in a nitrogen or hydrogen atmosphere at about 450–700° C. for about 10–60 minutes. As a result of the oxygen plasma treatment, titanium oxides are formed in the form of islands in the titanium nitride layer of the barrier layer. As a result of this treatment, the barrier capability of the barrier layer is improved.

Titanium oxides in the form of islands may be formed in the barrier layer by an alternative method. For example, a heat treatment may be conducted at temperatures of about 400–800° C. in a lamp anneal furnace containing therein at least several hundreds ppm—several % of oxygen. The barrier capability of the barrier layer can also be further improved.

Next, a heat treatment, including a degasification process, is described below.

Lamp heating (heat treatment A) is conducted in a lamp chamber under base pressures of about $1.5 \times 10^{-4}$ Pa or lower at temperatures of about 150–250° C. for about 30–60 seconds. Then, in another chamber where argon gas is introduced at pressures of about $1 \times 10^{-1}$–$15 \times 10^{-1}$ Pa, a heat treatment (degasification step: heat treatment B) is conducted at temperatures of about 300–550° C. for about 30–120 seconds to perform a degasification process.

In this step, first, as a primary object, the entire wafer, including its rear surface and side surface, is heat treated in the heat treatment A to remove water content that adheres to the wafer.

Then, in the heat treatment B, gasification components (oxygen, hydrogen, water and nitrogen) in the planarization layer (such as the BPSG layer that forms the interlayer dielectric layer 20) are removed, as a main object. As a result, generation of gasification components from the BPSG layer can be prevented during film formation of an aluminum film conducted in the next step.

The barrier layer contains several ten atom % of gasification components (oxygen, hydrogen, water, nitrogen) in solid solution. Accordingly, the gasification components in the interlayer dielectric layer 20 are removed after forming the barrier layer in order to successfully form an aluminum layer in the through holes. Unless the gasification components are sufficiently removed from the planarization layer below the barrier layer, there are instances where the gasification components in the planarization layer may be discharged and enter the barrier layer at a barrier layer formation temperature (normally 300° C. or higher). Further, the gases are discharged from the barrier layer when an aluminum film is formed and come out into a boundary between the barrier layer and the aluminum film, causing deteriorating effects on cohesiveness and fluidity of the aluminum layer.

Further, depending on the requirements, a film of a metal such as titanium, niobium or tungsten is formed to a film thickness of 20–50 nm at normal temperatures to thereby form a wetting layer 35.

Before cooling the wafer, a heat treatment (heat treatment C) is conducted in a lamp chamber at temperatures of about 150–250° C. for about 30–60 seconds under base pressures of about $1.5 \times 10^{-4}$ Pa or lower to remove substances such as water adhered to the substrate. Then, before an aluminum layer is formed, the substrate temperature is lowered to about 100° C. or lower and, more preferably, to the normal temperature—50° C. This cooling process lowers the temperature of the substrate which has been heated up through the heat treatment C. For example, the wafer is placed on a stage equipped with a water cooling function to cool the wafer to a predetermined temperature.

By cooling the wafer in the manner described above, the amount of gases which may be discharged from the interlayer dielectric layer 20, the barrier layer and the entire surface of the wafer at the time of film formation of the first aluminum layer is reduced to a minimum amount. This cooling step is effective in preventing deteriorating effects of the gases which may be adsorbed on the boundary between the barrier layer and the aluminum layer 36 and damage their coverage and cohesiveness.

The cooling step may preferably be performed using a sputter apparatus for forming aluminum films that has a plurality of chambers. Preferably, each of the chambers has a structure similar to one another or substantially the same structure. For example, the sputter apparatus may have a stage equipped with a cooling capability, and a substrate may be placed on the stage to reduce the substrate temperature to a predetermined temperature.

Figure 9:
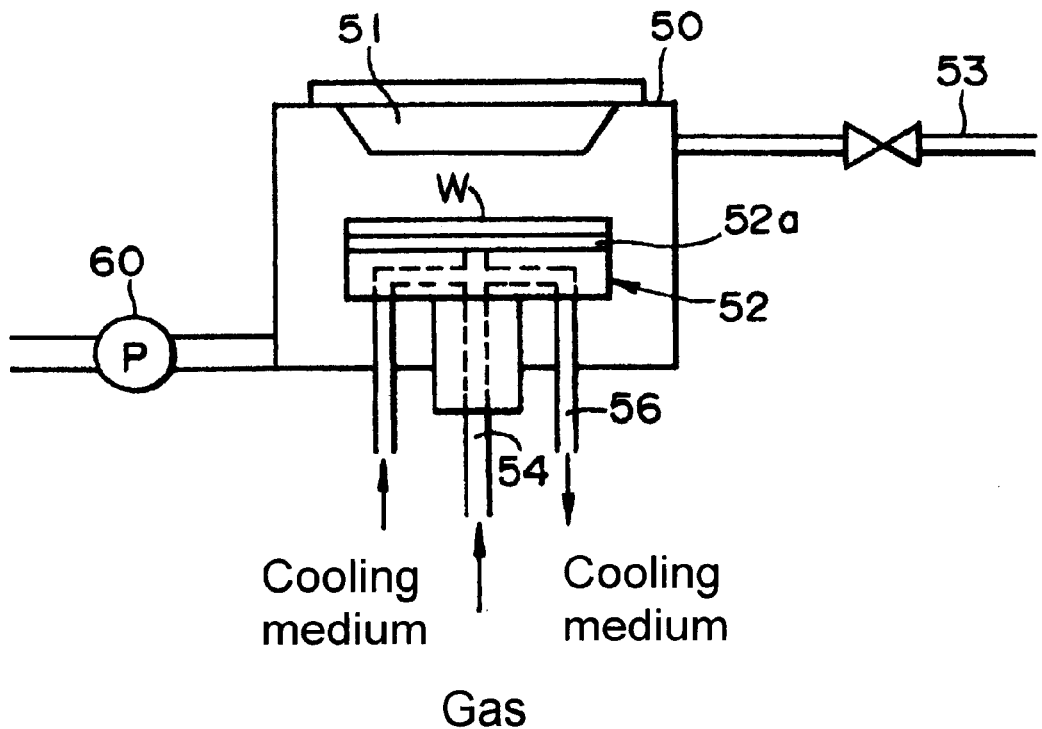
FIG. 9($a$) schematically shows an example of a sputter apparatus used for a process for making a semiconductor device in accordance with the present invention, and FIG. 9($b$) shows an example of a stage of the sputter apparatus.
Figure 9:
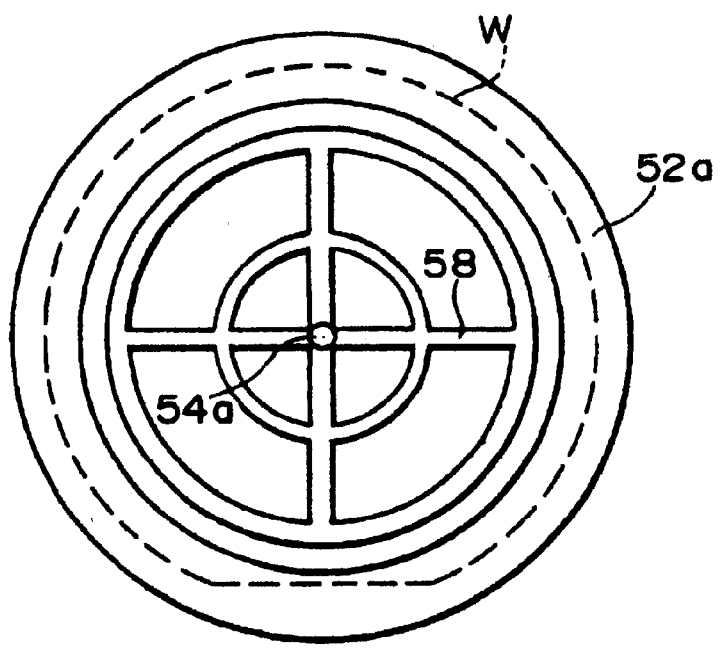

FIG. 9(*a*) schematically shows an example of a sputter apparatus, including a stage that is equipped with a cooling function. FIG. 9(*b*) is a plan view of an example of a stage.

The sputter apparatus has a plurality of chambers 50. Each of the chambers has a similar structure or substantially the same structure. The chamber 50 contains a target 51, functioning also as an electrode, and an electrode 52, functioning as a stage. The electrode 52 is structured to mount a substrate (wafer) W to be cooled. The chamber 50 is provided with an exhaust device 60 that maintains the interior of the chamber in a reduced pressure state and a first gas supply channel 53 for supplying gases to the chamber for sputtering aluminum layers. The electrode 52 defines a top surface and includes a protruded support section 52*a*, provided on the top surface along an outer periphery of the electrode 52 as shown in FIG. 9(*b*). The protruded support section 52*a* provides a predetermined space between the electrode 52 and the substrate W when the substrate W is placed on the electrode 52. Further, a second gas supply channel 54 is connected to the electrode 52. A heat conductive medium, such as, for example, argon gas, is supplied in the space between the electrode 52 and the substrate W through the second gas supply channel 54. The electrode 52 also serves as a cooling system to cool the substrate W. The electrode 52 is controlled to have a constant temperature by a coolant that is supplied through a coolant supply channel 56, for example, by a circular flow of water. The top surface of the electrode 52 has grooves 58 formed in a specified pattern, for example, as shown in FIG. 9(*b*), to uniformly supply gases in the space. A gas discharge port 54*a*, communicating with the second gas supply channel 54, is provided generally at an intersection of the grooves.

The above-described sputter apparatus is operated to cool the substrate (wafer) in the following manner.

The interior of the chamber 50 is placed in a reduced pressure state of about $6 \times 10^{-6}$ Pa or lower by the exhaust device 60. The substrate W is mounted on the support section 52*a* of the electrode 52. The substrate W is cooled while a gas that serves as a heat conductive medium between the electrode 52 and the substrate W is supplied in the space between the electrode 52 and the substrate W through the second gas supply channel 54. The pressure of the space is maintained at about 600–1000 Pa, and gases that leak from the space into the chamber are exhausted by the exhaust device 60.

Figure 6:
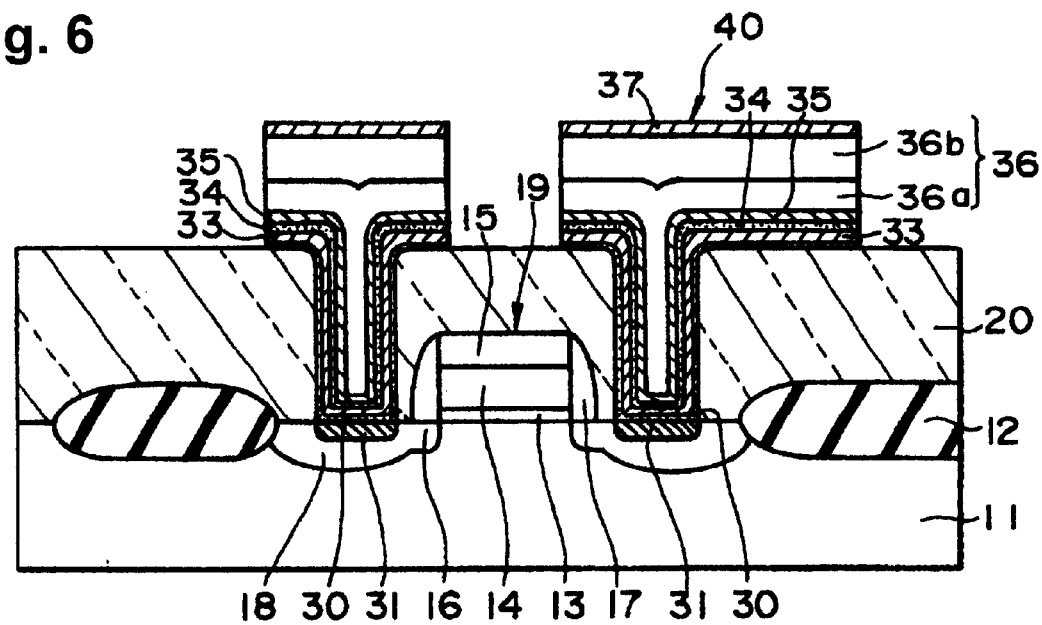
FIG. 6 schematically shows a step in the process for making a semiconductor device in cross-section that is successively performed after the step shown in FIG. 5.
Figure 7:
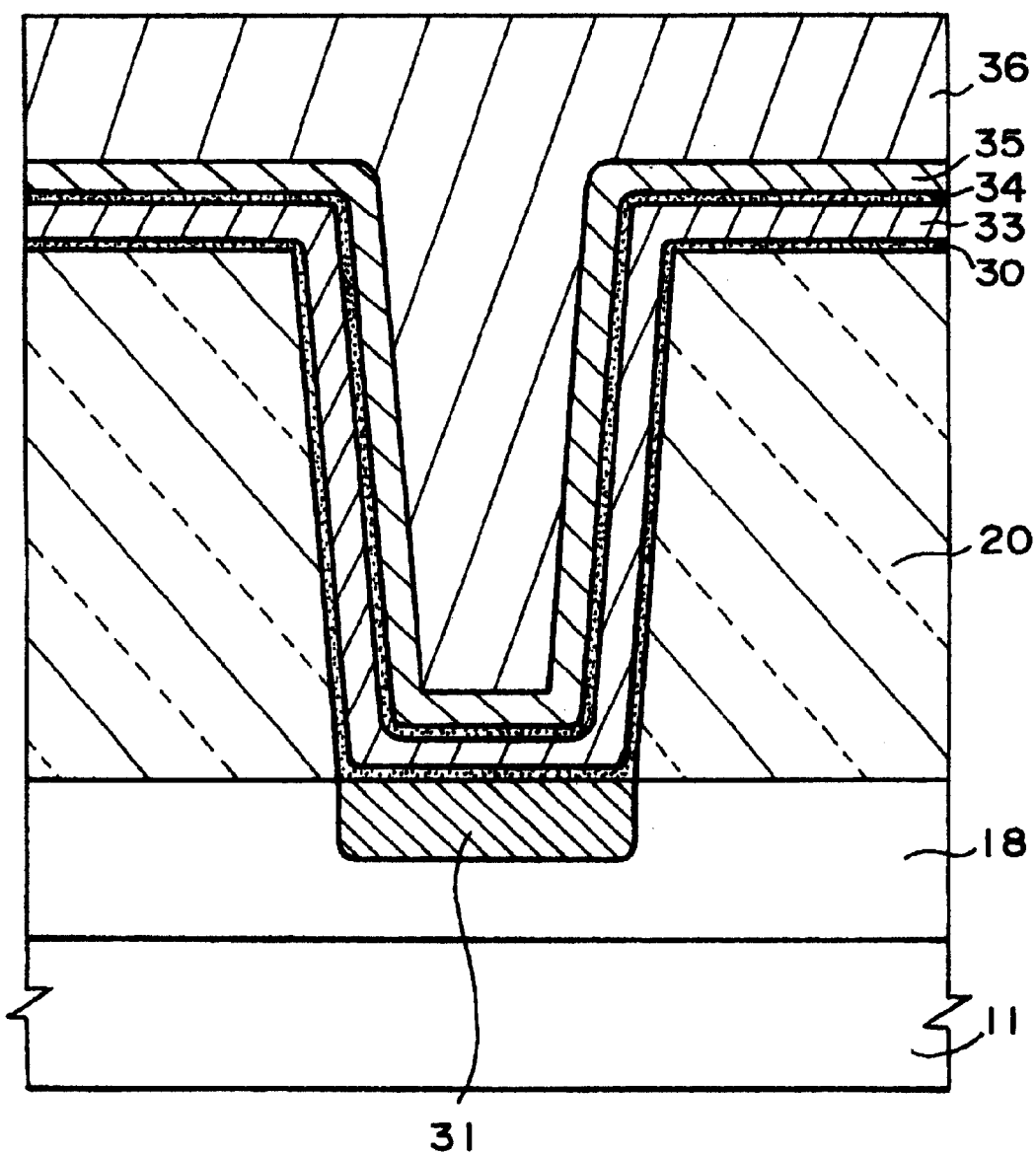
FIG. 7 shows a main section of the semiconductor device in an enlarged cross-section.

First, a first aluminum layer 36*a*, shown in FIG. 6, is formed by sputtering aluminum containing about 0.2–1.0 wt % of copper at a high speed at temperatures of about 200° C. or lower and, more preferably, at about 30–100° C., to a film thickness of about 150–300 nm. In this film formation step, the distance between the target and the wafer may preferably be set at about 40–200 mm. Then, the substrate temperature is elevated to about 350–460° C. in the same chamber, and aluminum similarly containing copper is sputtered at a low speed to form a second aluminum layer 36b having a thickness of about 300–600 nm. In this film formation step, the distance between the target and the wafer may preferably be set at 40–200 mm. Here, the level of "high speed" for film formation of the aluminum layers 36 may vary, depending on the film forming condition and design specifications of a device to be manufactured. However, in this embodiment, the term "high speed" refers to sputtering speeds of about 10 nm/second or faster, and the term "low speed" refers to sputtering speeds of about 3 nm/second or slower.

Aluminum sputtering may preferably be performed in the sputter apparatus, shown in FIG. 9, that is used when the wafer is cooled. In this manner, the cooling process and the aluminum film forming process are conducted in the same apparatus that is controlled to have a reduced pressure condition. As a result, the number of steps required for moving and mounting substrates is reduced, and therefore the process is simplified and pollution of the substrates is prevented.

Both of the first gas supply channel 53 and second gas supply channel 54, in the sputter apparatus shown in FIG. 9, supply argon gas. The temperature of the aluminum layer during the film formation process is the temperature (substrate temperature) of the substrate (wafer) W that is controlled by the gas supplied through the second gas supply channel 54.

For example, the substrate temperature is controlled as follows. The stage 52 is pre-heated and its temperature is set at a film forming temperature for forming the second aluminum layer 36b (at about 350–500° C.). When the first aluminum layer is formed, the substrate temperature is gradually increased by heat of the stage 52 without gas supply from the second gas supply channel 54. When the second aluminum layer is formed, the substrate temperature is controlled to rapidly elevate by supplying heated gas through the second gas supply channel 54, and then stabilize at a predetermined temperature level.

By successively forming the first aluminum layer 36a and the second aluminum layer 36b in the same chamber, the temperature and the power for sputtering can be precisely controlled and stable aluminum films are effectively formed at a lower temperature than the conventional method.

The film thickness of the first aluminum layer 36a is selected to be in an appropriate range in consideration of the capability of forming successive layers with good step coverage and the capability to control discharge of gasification components from the barrier layer and the interlayer dielectric layer 20 below the aluminum layer 34. For example, the film thickness may preferably be about 200–400 nm. The film thickness of the second aluminum layer 36b is determined by the size of a through hole and its aspect ratio. For example, the film thickness of about 300–1,000 nm is necessary to cover a through hole having a diameter of about 0.5 μm or smaller and an aspect ratio of about 3.

Further, an anti-reflection layer 37 is formed to a film thickness of about 30–80 nm by sputter-depositing titanium nitride in another sputter chamber. Then, a metal wiring layer 40 is patterned by selectively etching a laminated layer of the barrier layer, the aluminum layer 36 and the anti-reflection layer 37, using an anisotropic dry etcher mainly containing $Cl_2$ and $BCl_3$ gases.

When the metal wiring layer 40 is formed in a manner described above, a through hole with an aspect ratio of 0.5–3 and a diameter of 0.2–0.8 μm is filled by the aluminum with good step coverage without creating voids.

A sample semiconductor device, having a structure as shown in FIGS. 6 and 7, is formed by the above-described method, and a cross-section of a region including the contact section is photographed by a transmission electron microscope (TEM). The sample used for the experiment is formed in the following manner.

As shown in FIGS. 1–6, an interlayer insulation layer 20 is formed on a silicon substrate 11 in which a device element is formed by the method described above, and through holes each having an aperture diameter of 0.3 μm and an aspect ratio of 4 are formed. Then, a titanium layer is formed to a film thickness of 70 nm under a pressure of $4 \times 10^{-2}$ Pa at a temperature of 250° C., using a super-long throw sputter apparatus in which the target and the wafer are separated from each other at 300 mm. By this step, a titanium layer having a film thickness of about 25 nm is formed at bottom sections of the through holes. No substantial overhang of the titanium layer is formed at the upper ends of the through holes. Then, the wafer is annealed at 400° C. for 20 minutes in a 100% hydrogen atmosphere. Thereafter, the wafer is placed in air. Then, a lamp-anneal is performed at 800° C. for 30 seconds in a nitrogen atmosphere under normal pressure. A degasification process is then performed at 460° C. in an argon gas atmosphere under normal pressure. Further, a titanium layer having a film thickness of 100 nm is formed as a wetting layer. Then, an Al—Cu alloy layer is formed to a film thickness of 300 nm at normal temperatures in a chamber in which the target and the wafer are separated from each other at 300 mm. Then, an Al—Cu alloy layer is formed to a film thickness of 300 nm in a chamber in which the target and the wafer are separated from each other at 170 mm. Further, a titanium nitride layer is formed to a film thickness of about 30 nm as an antireflection layer.

Compositions and film thickness of each layer of the contact section of the sample thus formed are measured based on the photographs taken by the transmission electron microscope. The following result is obtained:

| | |
|---|---|
| Silicon substrate (Si) | |
| Titanium silicide layer ($TiSi_2$) | 75 nm |
| First titanium oxide layer ($TiO_2$) | 10 nm |
| Titanium nitride layer ($Ti_2N$) | 25 nm |
| Second titanium oxide layer ($TiO_2$) | 10 nm |
| Aluminum-titanium layer ($Al_3Ti$) | 150 nm |
| Aluminum-copper layer (Al—Cu) | |

It is confirmed that the first and second titanium oxide layers have amorphous structures.

Titanium that forms the wetting layer reacts with aluminum and forms an $Al_3Ti$ alloy, and the aluminum (Al—Cu) films are formed on the wetting layer. It is confirmed that the barrier layer does not react with the $Al_3Ti$ alloy and has a stable and excellent barrier capability and conductivity.

Figure 8:
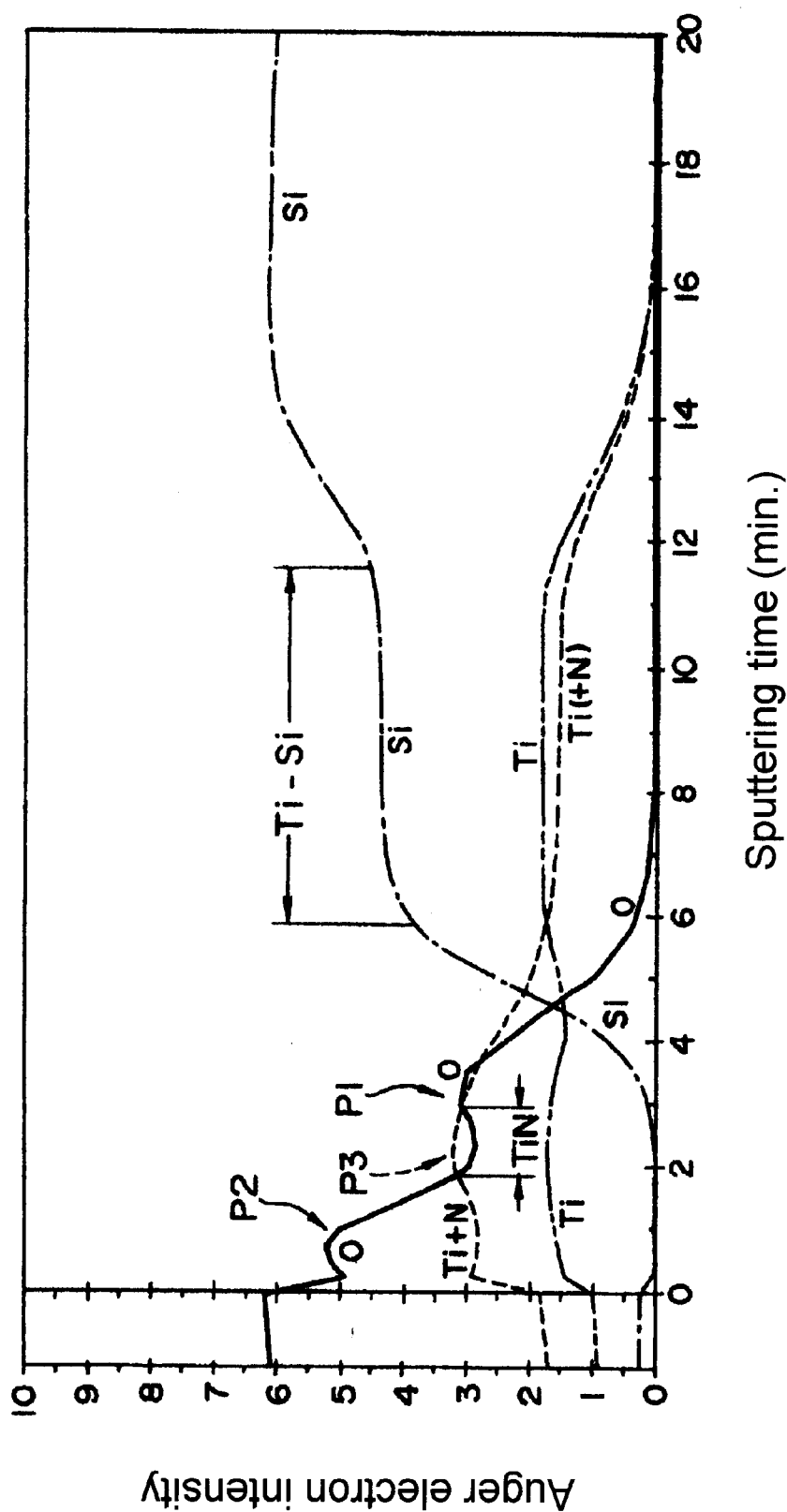
FIG. 8 shows SIMS results of samples of semiconductor devices in accordance with the present invention.

FIG. 8 shows profiles of measurement results obtained by Auger electron spectroscopy. Sputtering time (in minutes) is indicated along an axis of abscissa, and Auger electron intensity is indicated along an axis of ordinate. FIG. 8 shows a region including the silicon substrate and the barrier layer. As shown in FIG. 8, peaks P1 and P2 of oxygen appear in a border region between the silicon substrate and the barrier layer and an area adjacent to the surface of the barrier layer, respectively. Accordingly, the presence of the first silicon oxide layer and the second silicon oxide layer is confirmed. Also, as shown in FIG. 8, a peak P3 of titanium nitride is present between the oxygen peak P1 and the oxygen peak P2.

Leak current characteristics of the samples of the present invention and samples for comparison are measured to determine effects of heat treatment. The samples for comparison are substantially the same as the samples of the present invention except that each barrier layer of the sample for comparison does not contain a silicon oxide layer. These samples are annealed under a variety of different conditions, and annealing conditions are obtained when leak currents occur at the contact section.

As a result, it is observed that, even when the samples of the present invention are annealed at 450° C. for 2 hours, the samples of the present invention do not cause leak currents or spike phenomena in which aluminum passes through the barrier layer and enters the silicon substrate. In contrast, the comparison samples cause leak currents when the comparison samples are annealed at 450° C. for 2 hours. Therefore, it is confirmed that the samples of the present invention have far superior barrier capabilities compared to the comparison samples.

Accordingly, in a semiconductor device in accordance with one embodiment of the present invention, a barrier layer may include a layer of an oxide of a metal that forms the barrier layer. As a result, the barrier layer maintains conductivity and has an excellent barrier capability.

In the embodiments described above, a contact section between a barrier layer and a substrate is formed by a barrier layer—silicon layer structure. However, the contact section may include a silicide layer, such as, for example, a titanium silicide layer, a cobalt silicide layer and the like, instead of the silicon layer. Also, a metal layer that forms the barrier layer may be formed by a CVD method instead of the sputtering method. Also, for example, copper may be used for a wiring layer instead of an aluminum alloy. In particular, when a wiring layer is plated with copper, a high cohesiveness between the wiring layer and a barrier layer and a high barrier capability of the barrier layer are required. As a consequence, there are only a few materials that can sufficiently serve as the barrier layer. However, a barrier layer of the present invention is also applicable to such a copper-wiring layer.

In the embodiments described above, a semiconductor device including an N-channel type MOS element is described. However, the present invention is applicable to a semiconductor device, including a P-channel type or CMOS type element.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:

a substrate having a device element;

an interlayer dielectric layer formed on the semiconductor substrate;

a though hole formed in the interlayer dielectric layer; and a barrier layer formed from a metal, the barrier layer being formed on surfaces of the interlayer dielectric layer and the through hole, wherein the barrier layer includes at least one metal oxide layer formed from an oxide of the metal that forms the barrier layer, and at least one metal nitride layer formed from a nitride of the metal that forms the barrier layer, wherein the at least one metal oxide layer includes a first metal oxide layer formed from an oxide of the metal that forms the barrier layer and a second metal oxide layer formed from the oxide of the metal that forms the barrier layer, the at least one metal nitride layer formed between the first metal oxide layer and the second metal oxide layer.

2. A semiconductor device according to claim 1, wherein the barrier layer defines a top surface and a bottom surface in contact with at least the interlay dielectric layer, the first metal oxide layer being formed adjacent the bottom surface of the barrier layer and the second metal oxide layer being formed adjacent the top surface of the barrier layer.

3. A semiconductor device according to claim 1, wherein the first and second metal oxide layers that form the barrier layer are in an amorphous state.

4. A semiconductor device according to claim 1, wherein the first metal oxide layer that forms the barrier layer has a film thickness of about 5–30 nm.

5. A semiconductor device according to claim 1, wherein the second metal oxide layer that forms the barrier layer has a film thickness of about 5–30 nm.

* * * * *